(12) United States Patent
Fuchino

(10) Patent No.: US 8,248,734 B2
(45) Date of Patent: Aug. 21, 2012

(54) WIRING CONNECTING STRUCTURE FOR PIEZOELECTRIC ACTUATOR, PIEZOELECTRIC ACTUATOR, AND HEAD SUSPENSION

(75) Inventor: Hideki Fuchino, Aikoh-gun (JP)

(73) Assignee: NHK Spring Co., Ltd., Kangawa (JP)

(*) Notice: Subject to any disclaimer, the term of this patent is extended or adjusted under 35 U.S.C. 154(b) by 316 days.

(21) Appl. No.: 12/630,661

(22) Filed: Dec. 3, 2009

(65) Prior Publication Data

US 2010/0177445 A1 Jul. 15, 2010

(30) Foreign Application Priority Data

Jan. 15, 2009 (JP) .................... 2009-006549

(51) Int. Cl.
*G11B 5/56* (2006.01)
*G11B 21/24* (2006.01)
*G11B 5/48* (2006.01)
*G11B 21/16* (2006.01)

(52) U.S. Cl. .............. 360/294.4; 360/245.8; 439/199; 310/365

(58) Field of Classification Search ............ 360/234.5, 360/264.2, 266.3, 271.9, 281.7, 245.8, 294.4; 439/190–192, 194–199, 205; 310/323.06, 310/363–366
See application file for complete search history.

(56) References Cited

U.S. PATENT DOCUMENTS

| | | | | |
|---|---|---|---|---|
| 5,808,836 A * | 9/1998 | Frater et al. | | 360/244.9 |
| 5,880,908 A * | 3/1999 | Shiraishi et al. | | 360/234.6 |
| 6,282,063 B1 * | 8/2001 | Coon | | 360/245.3 |
| 6,327,120 B1 * | 12/2001 | Koganezawa et al. | | 360/294.4 |
| 6,574,077 B1 * | 6/2003 | Crane et al. | | 360/294.3 |
| 2002/0089793 A1 * | 7/2002 | Nakagawa et al. | | 360/294.4 |
| 2002/0118492 A1 * | 8/2002 | Watanabe et al. | | 360/294.4 |
| 2002/0171968 A1 * | 11/2002 | Nakagawa | | 360/75 |
| 2004/0070888 A1 * | 4/2004 | Mastromatteo et al. | | 360/294.4 |
| 2009/0190263 A1 * | 7/2009 | Miura et al. | | 360/245.8 |

FOREIGN PATENT DOCUMENTS

| JP | 2002-050140 | 2/2002 |
|---|---|---|
| JP | 2003-061371 | 2/2003 |

* cited by examiner

*Primary Examiner* — Daniell L Negron
*Assistant Examiner* — Adam B Dravininkas
(74) *Attorney, Agent, or Firm* — Jordan and Hamburg LLP

(57) ABSTRACT

A wiring connecting structure for a piezoelectric actuator includes a terminal 57-1, a through hole 67 formed through the terminal 57-1, a first liquid stopper 69-1 arranged around the through hole 67 in a gap between the terminal 57-1 and a common electrode 19 of a piezoelectric element 13 of the piezoelectric actuator, and a liquid trap 73 arranged adjacent to the first liquid stopper 69-1. The terminal 57-1 faces the common electrode 19 with an electric insulating layer 61 being on the piezoelectric element 13 side and the first liquid stopper 69-1 being in the gap between the common electrode 19 and the terminal 57-1. A liquid conductive adhesive 79 is filled in the through hole 67. If there is an excess of the liquid adhesive 79, the excess is guided into a trapping space 77 of the liquid trap 73, to prevent the excess from oozing out.

10 Claims, 13 Drawing Sheets

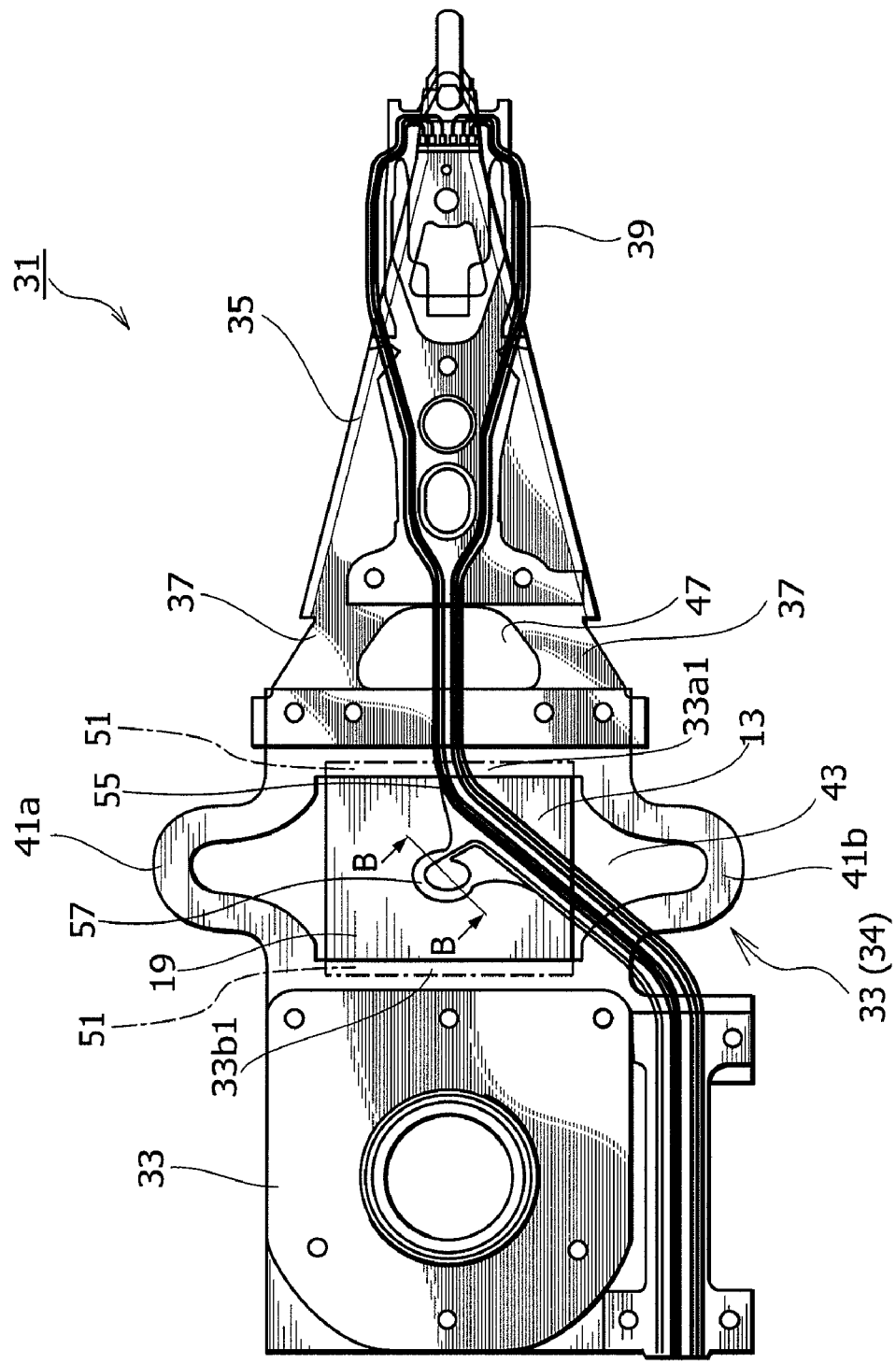

WIRING CONNECTING STRUCTURE FOR PIEZOELECTRIC ACTUATOR, PIEZOELECTRIC ACTUATOR, AND HEAD SUSPENSION

BACKGROUND OF THE INVENTION

1. Field of the Invention

The present invention generally relates to a piezoelectric actuator having a piezoelectric element that warps in response to applied electric power to minutely move an objective part relative to a base part. In particular, the present invention relates to a wiring connecting structure capable of achieving wiring to the piezoelectric element without damaging the piezoelectric element or deteriorating the reliability thereof. The present invention also relates to the piezoelectric actuator and a head suspension employing the piezoelectric actuator.

2. Description of Related Art

Small-sized, precision information devices are rapidly advancing, and for use with such devices, needs for micro-actuators capable of conducting positioning control for very small distances are increasing. Such micro-actuators are highly needed by, for example, optical systems for correcting focuses and inclination angles, ink jet printers for controlling ink heads, and magnetic disk drives for controlling magnetic heads.

The applicant of the present invention has proposed in Japanese Unexamined Patent Application Publication No. 2002-50140 a head suspension for a disk drive, having a base plate, a connection plate attached to the base plate and provided with a hinge thinner than the base plate, a load beam attached to the connection plate, a flexure attached to the load beam and provided with a slider, and a pair of piezoelectric elements.

This related art employs a dual actuator system that involves, for a precise positioning purpose, a voice coil motor and the piezoelectric elements made of, for example, PZT (lead zirconate titanate). The piezoelectric elements form a piezoelectric actuator to minutely drive a front end of the load beam or only the slider in a widthwise direction (sway direction) of the head suspension. Compared with a single actuator system employing only the voice coil motor, the dual actuator system employing the voice coil motor and piezoelectric actuator more precisely positions a magnetic head attached to a front end of the head suspension.

An important issue for the head suspension employing the dual actuator system is how to supply electricity to the piezoelectric elements.

A technique to approach this issue is disclosed in Japanese Unexamined Patent Application Publication No. 2003-61371 (in particular, FIGS. 9 and 10 thereof). This related art arranges a pair of wires on the head suspension. One of the wires is connected through wire bonding to a base electrode and the other wire is connected through wire bonding to an exposed part of the top face of each piezoelectric element.

This related art has a risk of cracking the piezoelectric element because, to secure a bonding strength, it applies a local stress on the brittle piezoelectric element when bonding the wire to the piezoelectric element.

If the wire bonding process is carried out with a reduced force not to crack the piezoelectric element, the bonding strength will be insufficient to deteriorate the reliability of electric connection to the piezoelectric element.

In this way, it is very difficult to carry out wiring to the piezoelectric element without damaging the same.

SUMMARY OF THE INVENTION

An object of the present invention is to provide a wiring connecting structure for a piezoelectric actuator, capable of achieving wiring to a piezoelectric element of the piezoelectric actuator without breaking the piezoelectric element or deteriorating the reliability thereof.

In order to accomplish the object, an aspect of the present invention provides a wiring connecting structure for a piezoelectric actuator having a piezoelectric element, the piezoelectric element being arranged on an object having a base part and a movable part, to minutely move the movable part relative to the base part according to deformation that occurs on the piezoelectric element in response to electric power applied thereto. The wiring connecting structure includes a terminal having an electric insulating layer that faces an electrode surface of the piezoelectric element and a wiring layer that is formed on a surface of the insulating layer not facing the electrode surface and is used to supply electric power to the electrode surface; a through hole formed in the terminal through at least the insulating layer; a first liquid stopper arranged around the through hole in a gap between the electrode surface and the terminal; a liquid trap arranged adjacent to the first liquid stopper; and a conductive adhesive filled in the through hole, the conductive adhesive being liquid when filled into the through hole. The conductive adhesive electrically connects the electrode surface and the wiring layer to each other. The liquid trap has a trapping space to accept an excess of the conductive adhesive that may develop when the conductive adhesive is filled into the through hole.

According to this aspect of the present invention, the electrode surface and the wiring layer are electrically connected to each other through the conductive adhesive. The liquid trap has the trapping space to receive an excess of the liquid adhesive when the liquid adhesive is filled into the through hole.

The first liquid stopper is present in the gap between the electrode surface and the terminal, to define a narrowed gap. When a liquid conductive adhesive is filled into the through hole, the adhesive demonstrates a capillary phenomenon at the narrowed gap so that the adhesive penetrates into and spreads in the narrowed gap.

In the gap between the electrode surface and the terminal out of the narrowed gap defined by the first liquid stopper, no capillary phenomenon occurs, and therefore, the liquid conductive adhesive will not penetrate into or spread in the gap outside the first liquid stopper.

Namely, the liquid adhesive does not spread out of an outer edge of the first liquid stopper. The outer edge of the first liquid stopper functions as a bank to contain the adhesive within the outer edge of the first liquid stopper. As a result, this aspect of the present invention secures electric connection between the electrode surface of the piezoelectric element and the terminal with a sufficient bonding strength without applying mechanical stress on the piezoelectric element.

According to the above-mentioned aspect of the present invention, the liquid trap has the trapping space to contain an excess of liquid adhesive when the liquid adhesive is filled into the through hole. Even if the quantity of the applied liquid adhesive is relatively large, the adhesive will not ooze out.

Consequently, the above-mentioned aspect can perform wiring to the piezoelectric element without spoiling the piezoelectric element or deteriorating the reliability thereof.

BRIEF DESCRIPTION OF THE DRAWINGS

FIG. 4 is a bottom plan view illustrating the head suspension of FIG. 1;

FIGS. 5A and 5B are views illustrating a wiring member of the head suspension of FIG. 1, in which FIG. 5A is a view seen from below the head suspension and FIG. 5B is a view seen from the piezoelectric element embedded in the head suspension;

FIGS. 6A and 6B are views illustrating a terminal according to Embodiment 1 of the present invention, in which FIG. 6A is a front view seen from a piezoelectric element side and FIG. 6B is a sectional view of an attached state taken along a line B-B of FIG. 4;

FIGS. 8A and 8B are views illustrating a terminal according to Embodiment 2 of the present invention, in which FIG. 8A is a front view seen from a piezoelectric element side and FIG. 8B is a sectional view of an attached state taken along the line B-B of FIG. 4;

FIGS. 9A and 9B are views illustrating a terminal according to Embodiment 3 of the present invention, in which FIG. 9A is a front view seen from a piezoelectric element side and FIG. 9B is a sectional view of an attached state taken along the line B-B of FIG. 4;

DETAILED DESCRIPTION OF EMBODIMENTS

Wiring connecting structures for piezoelectric actuators, piezoelectric actuators, and head suspensions according to embodiments of the present invention will be explained in detail with reference to the drawings.

First, a head suspension according to an embodiment of the present invention will be explained.

Figure 1:
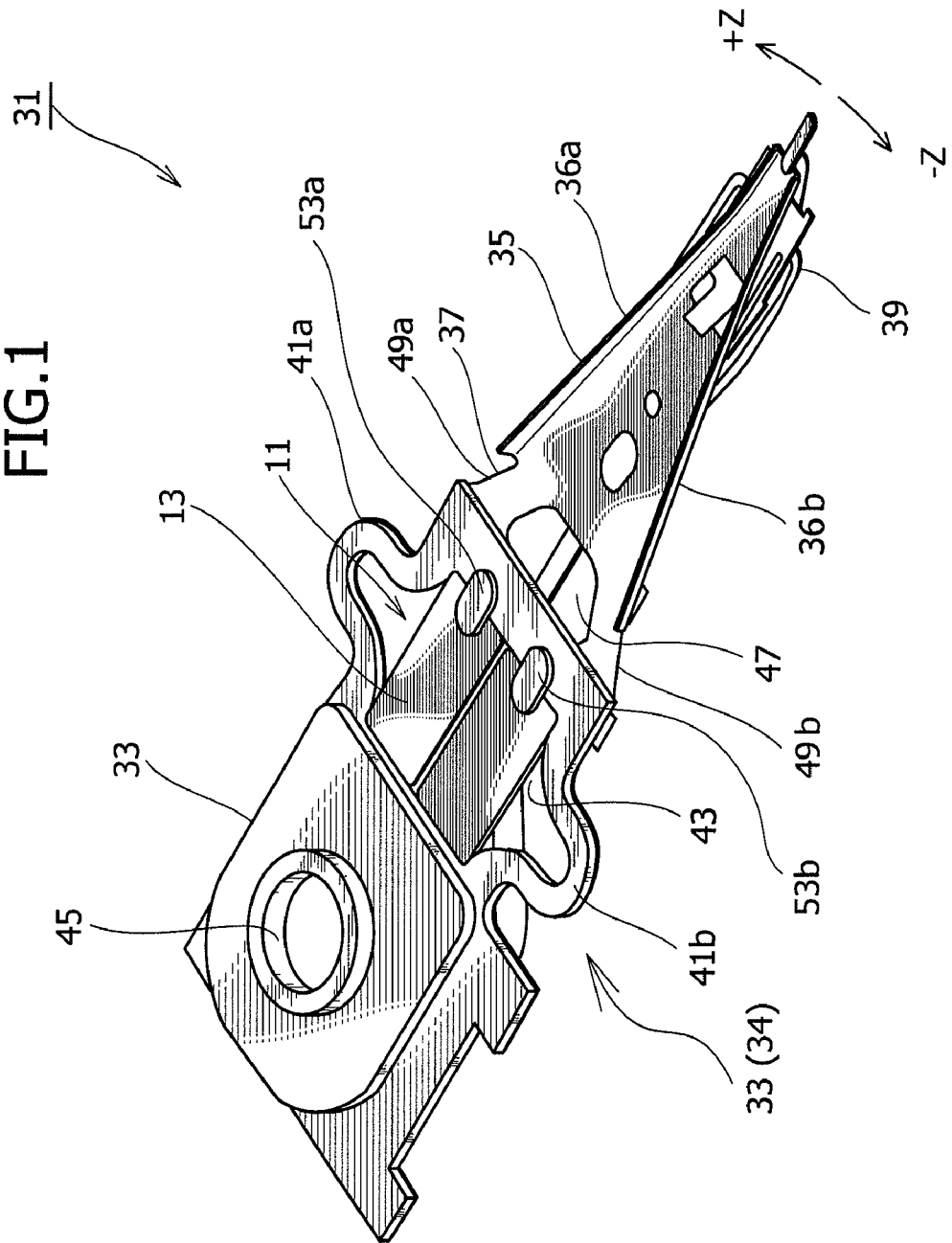
FIG. 1 is a perspective view illustrating a head suspension according to an embodiment of the present invention.

FIG. 1 is a perspective view illustrating the head suspension 31 according to an embodiment of the present invention.

The head suspension 31 includes a piezoelectric actuator 11 having a piezoelectric element 13 that deforms according to an applied voltage, a base plate 33 that corresponds to the "base part" stipulated in the claims, a load beam 35, a connection plate 37 functioning as a hinge, and the like.

The base plate 33 has an opening 43 in which the piezoelectric element 13 is embedded. The piezoelectric element 13 deforms in response to an applied voltage, to move a front end of the load beam 35 in sway directions, i.e., lateral directions of the load beam 35.

The base plate 33 resiliently supports the load beam 35 and is made of a stainless steel thin plate having a thickness of, for example, about 150 to 200 µm.

The base plate 33 has a pair of flexible parts 41a and 41b each having a U-shape, the opening 43 accommodating the piezoelectric element 13, and a boss 45 that is substantially circular. The flexible parts 41a and 41b each are outwardly curved at a location corresponding to a side face of the piezoelectric element 13.

The base plate 33 is fixed to a front end of an actuator arm (not illustrated) that is driven and turned by a voice coil motor (not illustrated).

The base plate 33 may be made of light metal such as aluminum alloy and a clad material consisting of light metal and stainless steel. Such a light material may reduce the inertia of the base plate 33, increase the resonant frequency of the head suspension 31 in the sway directions, and improve the tracing performance of the head suspension 31.

Instead of providing the base plate 33 with the flexible parts 41a and 41b and opening 43, it is possible to use an actuator plate 34 provided with the flexible parts 41a and 41b and opening 43. In this case, a rear end of the actuator plate 34 is laid on the base plate 33 and is fixed thereto by proper fixing means such as laser welding.

Namely, the present invention covers not only a head suspension having both the base plate 33 and actuator plate 34 but also a head suspension having only the base plate 33.

In the following explanation, the actuator plate 34 is considered to be integral with the base plate 33, for the sake of simplicity of explanation.

The load beam 35 has a flexure 39. A front end of the flexure 39 supports a slider (not illustrated) having a magnetic head. The load beam 35 is made of a stainless steel plate having a thickness of about 30 to 150 µm and is designed to apply load onto the slider.

The flexure 39 has a wiring member 55 to supply electric power to electrodes of the piezoelectric element 13 and transmit read/write signals to and from the magnetic head. The flexure 39 is made of a stainless steel thin plate spring that is thinner and more precise than the load beam 35.

The load beam 35 has longitudinal bent edges 36a and 36b to improve the rigidity of the load beam 35. A rear end of the load beam 35 is integral with the connection plate 37.

The load beam 35 may be made of light metal such as aluminum alloy and a clad material consisting of light metal and stainless steel. Such a light material may reduce the inertia of the load beam 35, increase the resonant frequency of the head suspension 31 in the sway directions, and improve the tracing performance of the head suspension 31.

The connection plate 37 is made of a resilient metal plate having a thickness of about 30 µm. A part of the connection plate 37 has a hole 47 to reduce rigidity in a thickness direction. On each side of the hole 47, there are hinges 49a and 49b that bend in the thickness direction. A rear end of the connection plate 37 is laid on the bottom face of a front end of the base plate 33 and is fixed thereto by proper fixing means such as laser welding.

The piezoelectric actuator 11 embedded in the head suspension 31 will be explained.

Figure 2:
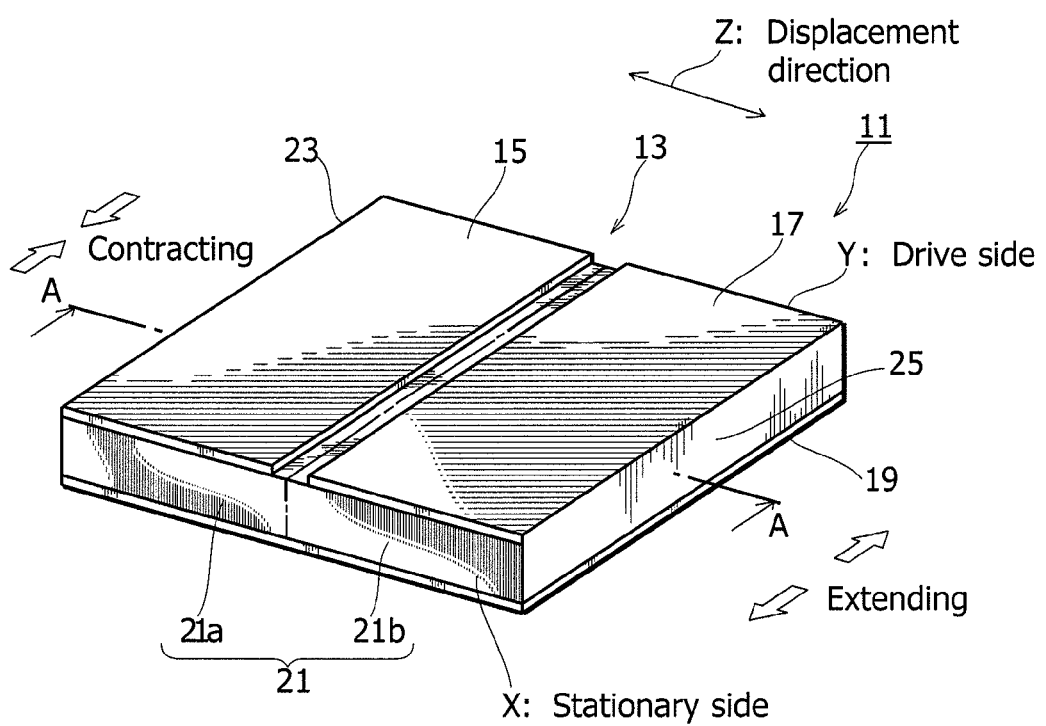
FIG. 2 is a perspective view illustrating a piezoelectric actuator embedded in the head suspension of FIG. 1.
Figure 3:
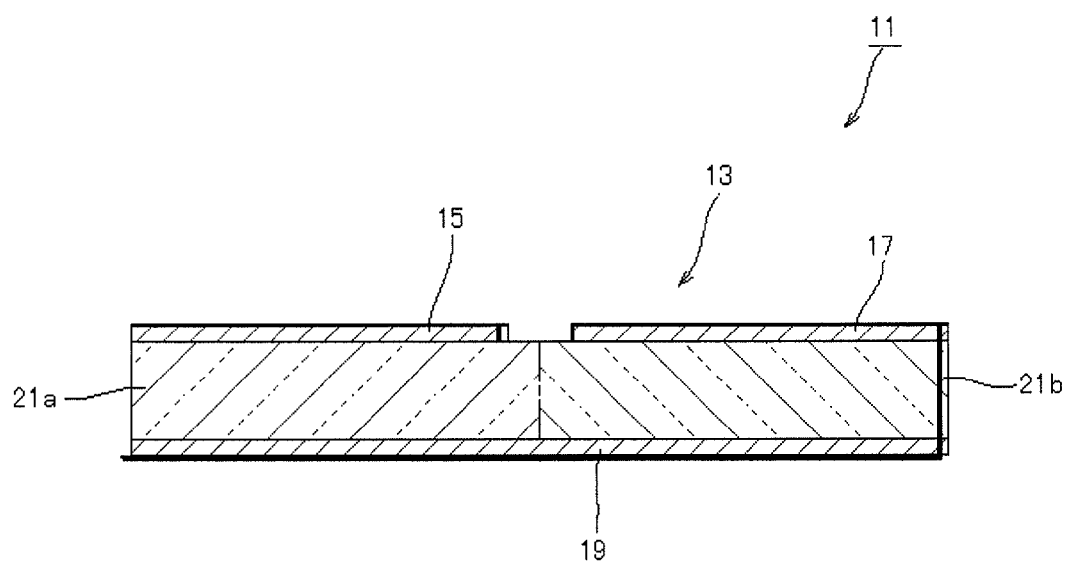
FIG. 3 is a sectional view taken along a line A-A of FIG. 2.

FIG. 2 is a perspective view illustrating the piezoelectric actuator 11 and FIG. 3 is a sectional view taken along a line A-A of FIG. 2.

In FIGS. 2 and 3, the piezoelectric actuator 11 has the piezoelectric element 13 substantially having a rectangular shape. The piezoelectric element 13 deforms in response to an applied voltage, and accordingly, the piezoelectric actuator 11 drives an objective part (the load beam 35). Deformation of the piezoelectric element 13 occurs when a voltage is applied thereto, or when the voltage applied thereto is stopped, or according to the level of a voltage applied thereto.

The piezoelectric element 13 includes first and second electrodes 15 and 17 that are arranged in a common plane and are separated from each other by a predetermined distance, a common electrode 19 opposing the first and second electrodes 15 and 17, and a piezoelectric material 21 arranged between the first and second electrodes 15 and 17 and the common electrode 19.

The first and second electrodes 15 and 17 and common electrode 19 may be made of metal having a low contact resistance, such as gold (Au).

The first and second electrodes 15 and 17 substantially have the same shape and size. The common electrode 19 is substantially equal in size and shape to a combination of the first and second electrodes 15 and 17.

The piezoelectric material 21 consists of a first piezoelectric material 21a that deforms according to a voltage applied to the first electrode 15 and a second piezoelectric material 21b that deforms according to a voltage applied to the second electrode 17. The first and second piezoelectric materials 21a and 21b are arranged so that they are oppositely polarized. The first and second piezoelectric materials 21a and 21b are made of, for example, piezoelectric ceramics that are polarized in polarization directions differing from each other by 180 degrees.

Operation of the piezoelectric actuator 11 will be explained. In FIG. 2, a side of the piezoelectric element 13 marked with "X" is a stationary side, a side marked with "Y" is a drive side, the first and second electrodes 15 and 17 are grounded, and the common electrode 19 receives a voltage.

When receiving the voltage, the piezoelectric element 13 deforms into a trapezoid with an end face 23 of the first electrode 15 contracting and an end face 25 of the second electrode 17 extending.

As a result, the piezoelectric element 13 moves in a direction Z (FIG. 2) by a very small distance, to move the part (load beam 35) attached to the drive side Y of the piezoelectric element 13.

When the common electrode 19 is grounded and the first and second electrodes 15 and 17 receive a voltage, the piezoelectric element 13 moves in a direction −Z (opposite to the direction Z) by a minute distance, to displace the part (load beam 35) attached to the drive side Y of the piezoelectric element 13.

The piezoelectric actuator 11 needs three electric systems for the first and second electrodes 15 and 17 and common electrode 19. This configuration simplifies wiring to the piezoelectric element 13 and secures the reliability thereof.

The piezoelectric actuator 11 has the single piezoelectric element 13, to reduce the number of parts, minimize parts management, and reduce the cost of the head suspension 31.

The head suspension 31 will be explained further.

FIG. 4 is a bottom view illustrating the head suspension 31 of FIG. 1.

As illustrated in FIGS. 1 and 4, the piezoelectric element 13 is embedded in the opening 43 formed in the base plate 33 of the head suspension 31, so that the first and second electrodes 15 and 17 are on top and the common electrode 19 is at the bottom. The top face of the base plate 33 is flush with the top electrode face of the piezoelectric element 13.

Front and rear ends of the peripheral edge of the opening 43 are partially etched to improve the adhesion of a nonconductive adhesive 51. The partial etching forms supports 33a1 and 33b1. Each of the supports 33a1 and 33b1 has a surface to support the surface of the common electrode 19 of the piezoelectric element 13.

Between the common electrode 19 of the piezoelectric element 13 and the supports 33a1 and 33b1, a layer of the nonconductive adhesive 51 having a proper thickness is present. The adhesive layer effectively transfers a deformation (displacement) of the piezoelectric element 13 to the load beam 35 and secures electric insulation between the common electrode 19 and the base plate 33 (supports 33a1 and 33b1).

A part where the base plate 33 overlaps the connection plate 37 corresponds to the drive side Y of the piezoelectric actuator 11.

Next, wiring connecting structures for piezoelectric actuators according to embodiments of the present invention will be explained.

Figure 5A:
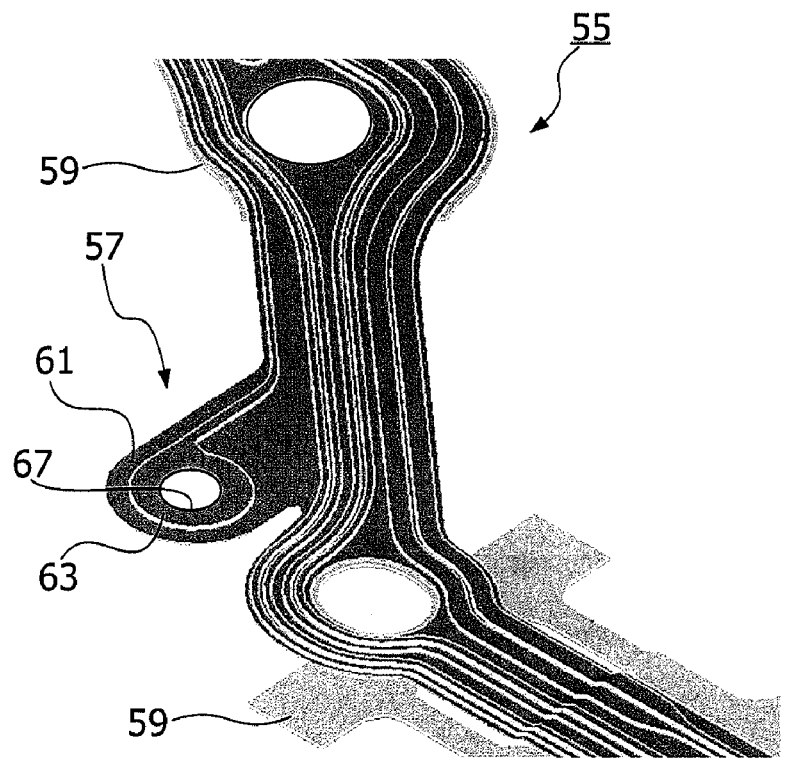
Figure 5B:
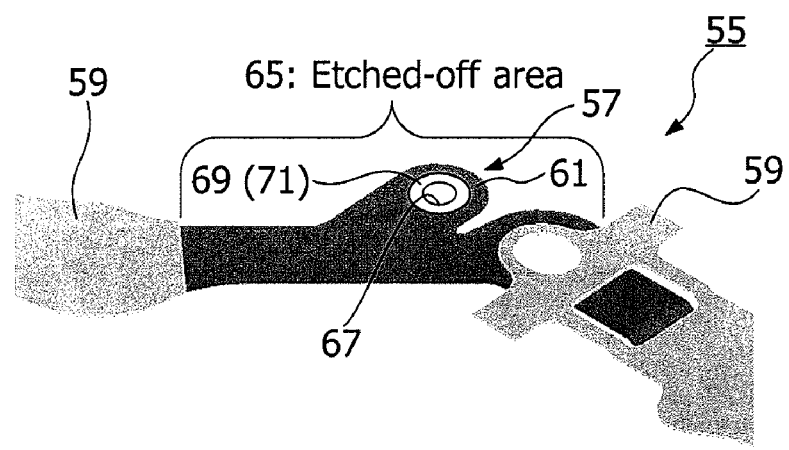
Figure 6A:
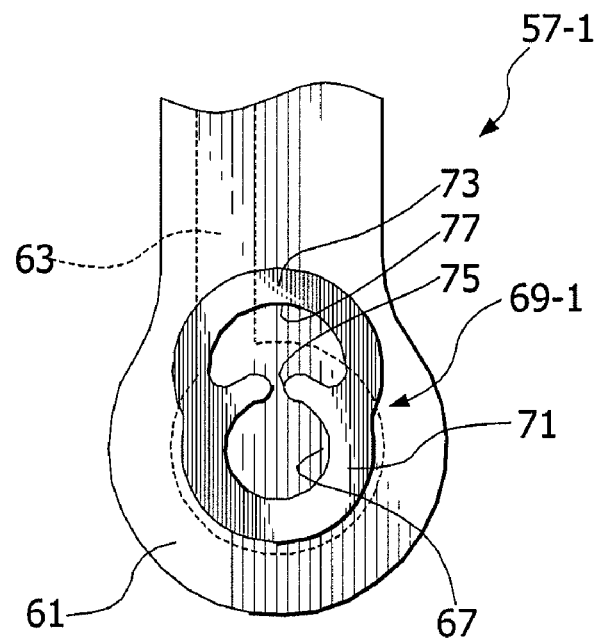
Figure 6B:
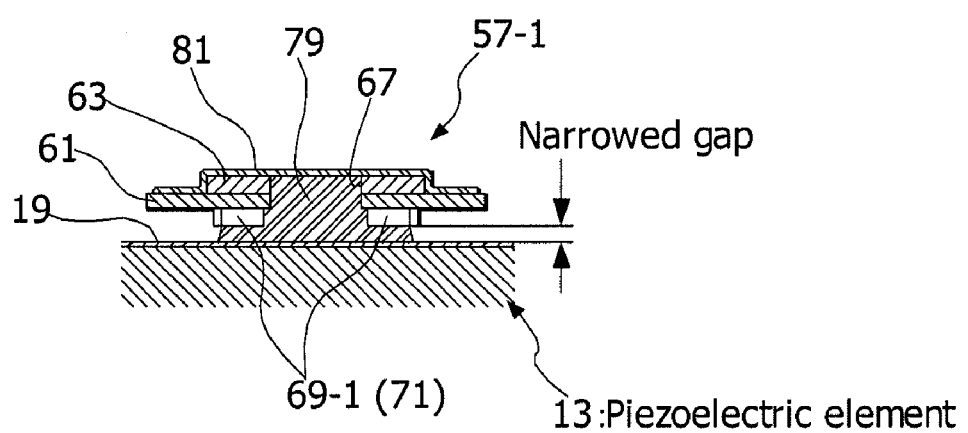

FIGS. 5A and 5B are views illustrating the wiring member 55 of the head suspension 31 of FIG. 1, in which FIG. 5A is a view seen from below the head suspension 31 and FIG. 5B is a view seen from the piezoelectric element 13 embedded in the head suspension 31. FIGS. 6A and 6B are views illustrating a terminal 57-1 according to Embodiment 1 of the present invention, in which FIG. 6A is a front view seen from the piezoelectric element 13 side and FIG. 6B is a sectional view of an attached state taken along the line B-B of FIG. 4.

When assembling the head suspension 31, the piezoelectric element 13 is positioned with respect to an inner circumference of the opening 43, so that the common electrode 19 (corresponding to the "electrode surface" stipulated in the claims) of the piezoelectric element 13 faces a terminal 57 of the wiring member 55 of the flexure 39 as illustrated in FIGS. 4, 5A, and 5B. Between the terminal 57 of the flexure 39 and the common electrode 19 of the piezoelectric element 13, there is a gap of several tens of micrometers. In this gap, the wiring connecting structure is arranged to secure electric connection between the terminal 57 and the common electrode 19.

First, a basic form of the wiring connecting structure according to the present invention will be explained. The basic form of the wiring connecting structure includes the terminal 57, a through hole 67, a first liquid stopper 69, a liquid trap 73, and a conductive adhesive 79.

As illustrated in FIG. 5A, the terminal 57 (wiring member 55) has a conductive base 59 (a stainless steel base of the flexure 39), an electric insulating layer 61 formed on the conductive base 59, and wiring 63 made of, for example, copper wires arranged on the insulating layer 61. The conductive base 59, insulating layer 61, and wiring 63 are successively layered one on another from the common electrode 19 side.

As illustrated in FIG. 5B, an area 65 of the terminal 57 (wiring member 55) that faces the common electrode 19 of the piezoelectric element 13 has no conductive base. Namely, in the area 65, the conductive base 59 is removed by etching, to prevent a short-circuit failure between the common electrode 19 and the conductive base 59. As a result, the insulating layer 61 faces the common electrode 19 in the area 65. The wiring 63 supplies electricity to the common electrode 19.

The through hole 67 is formed through the insulating layer 61 and wiring 63 of the terminal 57. The through hole 67 may be formed at least through the insulating layer 61 of the terminal 57 because electric connection between the common electrode 19 and the wiring 63 will be secured if the through hole 67 is formed at least through the insulating layer 61.

The first liquid stopper 69 is formed around the through hole 67 in a gap between the common electrode 19 and the terminal 57. When the conductive adhesive 79 in a liquid state is filled into the through hole 67, the first liquid stopper 69 narrows the gap between the common electrode 19 and the terminal 57, to define a narrowed gap and cause a capillary phenomenon in the narrowed gap. The first liquid stopper 69 may be separate from the conductive base layer 59 and may be attached to one of the terminal 57 and the surface of the common electrode 19.

The first liquid stopper 69 must be a solid obstacle against the liquid conductive adhesive 79, and therefore, is made of a proper material such as metal and resin that is not corroded or dissolved by the adhesive 79.

The liquid trap 73 has a trapping space 77 to receive an excess of the liquid conductive adhesive 79 when the adhesive 79 is filled in the through hole 67. The liquid conductive adhesive 79 keeps liquidity when injected into the through hole 67, and thereafter, looses the liquidity and hardens. The liquid trap 73 is arranged adjacent to the first liquid stopper 69. The conductive adhesive 79 is, for example, silver paste, or any other proper adhesive.

The common electrode 19 and wiring 63 are electrically connected to each other through the conductive adhesive 79. The trapping space 77 of the liquid trap 73 accepts an excess of the conductive adhesive 79 that may occur when the adhesive 79 in a liquid state is filled into the through hole 67.

Between the base plate 33 and the first and second electrodes 15 and 17 of the piezoelectric element 13, conductive adhesives 53a and 53b are applied as illustrated in FIG. 1, to secure electric connection between the electrodes 15 and 17 and the base plate 33.

In this way, the basic form of the wiring connecting structure electrically connects the common electrode 19 and wiring 63 to each other through the conductive adhesive 79 and arranges the liquid trap 73 having the trapping space 77 to contain an excess of the conductive adhesive 79, if any.

When the liquid conductive adhesive 79 is filled into the through hole 67, the first liquid stopper 69 is present in the gap between the common electrode 19 and the terminal 57, to form the narrowed gap. The narrowed gap produces a capillary phenomenon to disperse the conductive adhesive 79 in the narrowed gap.

In the relatively wide gap between the electrode 19 and the terminal 57 out of the narrowed gap defined by the first liquid stopper 69, no capillary phenomenon occurs, and therefore, the adhesive 79 will not penetrate into or spread in the wide gap.

Namely, the adhesive 79 does not ooze out of an outer edge of the first liquid stopper 69. The outer edge of the first liquid stopper 69 functions as a bank to contain the adhesive 79 within there. As a result, the basic form of the wiring connecting structure secures electric connection between the common electrode 19 of the piezoelectric element 13 and the terminal 57 with a sufficient bonding strength without applying mechanical stress on the piezoelectric element 13.

The liquid trap 73 has the trapping space 77 to contain an excess of the adhesive 79 when the adhesive 79 is filled into the through hole 67. Even if the quantity of the applied liquid adhesive 79 is relatively large, the adhesive 79 will not ooze outside.

Consequently, the basic form of the wiring connecting structure can perform wiring to the piezoelectric element 13 without spoiling the piezoelectric element 13 or deteriorating the reliability thereof.

The basic form of the wiring connecting structure, however, has a risk of oozing out the conductive adhesive 79 if the quantity of the conductive adhesive 79 filled into the through hole 67 is too much. If the adhesive 79 oozes, it deteriorates the rigidity balance and vibration characteristic of the head suspension 31 and causes a short circuit between the common electrode 19 and any conductive part of the head suspension 31.

This problem is solved by the wiring connecting structure employing the terminal 57-1 of Embodiment 1 illustrated in FIGS. 6A and 6B.

In FIG. 6A, the terminal 57-1 according to Embodiment 1 has a first liquid stopper 69-1. The first liquid stopper 69-1 has a stopper part 71 substantially having an annular shape and a liquid trap 73 integral with the stopper part 71.

The stopper part 71 of the first liquid stopper 69-1 has a cut 75 to guide an excess of the liquid conductive adhesive 79 to the liquid trap 73. Namely, the cut 75 guides an excess of the liquid conductive adhesive 79 into a trapping space 77 of the liquid trap 73.

Compared with the cut 75, the trapping space 77 has an extended space. Even if the adhesive 79 filled into the through hole 67 causes a relatively large amount of excess, the excess is guided into the wide trapping space 77 of the liquid trap 73, to prevent the adhesive 79 from oozing out.

The first liquid stopper 69-1 is formed by partly leaving the conductive base 59 around the through hole 67 when the conductive base 59 in the area 65 (FIG. 5B) is etched off. In this case, the first liquid stopper 69-1 must electrically be insulated from the remaining part of the conductive base 59, to avoid a short circuit between the common electrode 19 and the conductive base 59.

Alternatively, the conductive base 59 in the area 65 (FIG. 5B) may completely be etched off, and then, the first liquid stopper 69-1 that is separate from the conductive base 59 may be arranged around the through hole 67. In FIG. 6B, the wiring 63 is entirely covered with a cover layer 81 to prevent the conductive adhesive 79 and wiring 63 from being oxidized.

Attaching the terminal 57-1 to the piezoelectric element 13 will be explained with reference to FIGS. 7A and 7B in which FIG. 7A explains a first attaching process of the terminal 57-1 and FIG. 7B explains a second attaching process of the same.

Figure 7A:
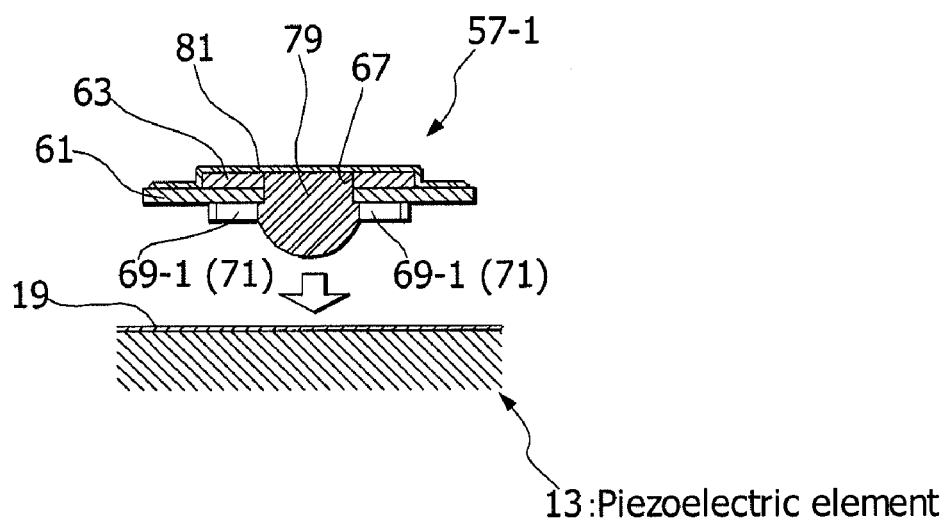
FIGS. 7A and 7B are sectional views illustrating processes of attaching the terminal of Embodiment 1 to a piezoelectric element.
Figure 7B:
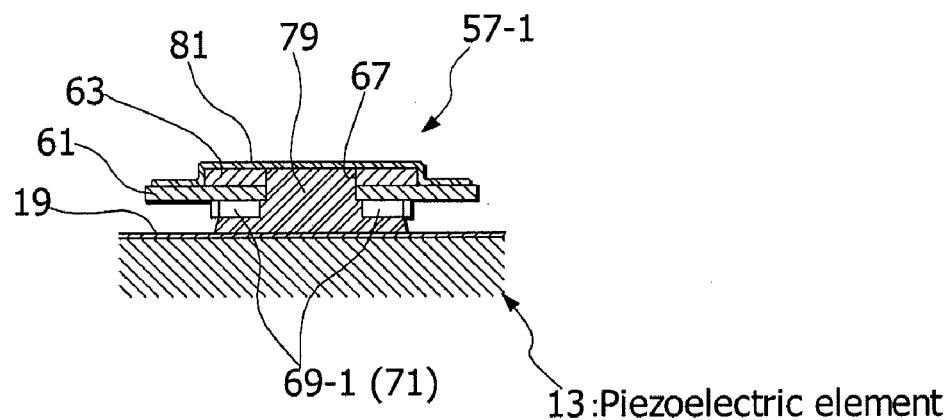

In FIG. 7A, the terminal 57-1 is inverted with an opening of the through hole 67 of the terminal 57-1 being at the top. In this state, the conductive adhesive 79 in a liquid state is filled into the through hole 67.

Thereafter, the terminal 57-1 is again inverted into the state of FIG. 7A, so that the insulating layer 61 of the terminal 57-1 faces the common electrode 19 of the piezoelectric element 13. Then, the terminal 57-1 is placed onto the common electrode 19 as illustrated in FIG. 7B.

At this time, the first liquid stopper 69-1 prevents the conductive adhesive 79 from spreading outward. If there is an excess of the conductive adhesive 79, it will be guided into the trapping space 77 of the liquid trap 73, to prevent the excess from oozing out.

When the liquid conductive adhesive 79 is filled into the through hole 67, the first liquid stopper 69-1 is present in the gap between the terminal 57-1 of the wiring connecting structure according to Embodiment 1 and the common electrode 19, to define the narrowed gap as illustrated in FIG. 6B. The narrowed gap produces a capillary phenomenon to disperse the conductive adhesive 79 within the narrowed gap.

In the relatively wide gap between the electrode 19 and the terminal 57-1 out of the narrowed gap defined by the first liquid stopper 69-1, no capillary phenomenon occurs, and therefore, the adhesive 79 will not penetrate into or spread in the wide gap.

Namely, the adhesive 79 does not ooze out of an outer edge of the first liquid stopper 69-1. The outer edge of the first liquid stopper 69-1 functions as a bank to contain the adhesive 79 within there. As a result, the wiring connecting structure according to Embodiment 1 secures electric connection between the common electrode 19 of the piezoelectric element 13 and the wiring 63 of the terminal 57-1 with a sufficient bonding strength without applying mechanical stress on the piezoelectric element 13.

If there is no liquid stopper in the gap between the common electrode 19 and the terminal 57-1, there will be no bank to prevent the liquid adhesive 79 from spreading.

Then, the liquid adhesive 79 filled in the through hole 67 will freely spread between the common electrode 19 and the terminal 57-1.

This produces problems of 1) hardly controlling the quantity of a liquid adhesive to be filled into the through hole 67 and hardly automating the adhesive filling operation into the through hole 67, 2) deteriorating the rigidity balance and vibration characteristic of the head suspension 31, and 3) an excess of the liquid adhesive causing a short circuit between the common electrode 19 and any conductive part of the head suspension 31.

To solve the problems, the wiring connecting structure according to Embodiment 1 interposes the liquid stopper 69-1 in the gap between the common electrode 19 and the terminal 57-1, to prevent the liquid conductive adhesive 79 filled in the through hole 67 from freely spreading between the common electrode 19 and the terminal 57-1.

Embodiment 1 is capable of 1) easily controlling the quantity of a liquid conductive adhesive to be filled into the through hole 67 and automating the adhesive filling operation into the through hole 67, 2) properly maintaining the rigidity balance and vibration characteristic of the head suspension 31, and 3) preventing the conductive adhesive 79 from freely spreading between the common electrode 19 and the terminal 57-1, to avoid a short circuit between the common electrode 19 and any conductive part of the head suspension 31.

If the liquid adhesive 79 filled in the through hole 67 is excessive, the excess is guided into the trapping space 77 of the liquid trap 73, to prevent the excess from oozing out. Namely, even if the liquid adhesive 79 is excessive, the excess never oozes outside.

Accordingly, Embodiment 1 can perform wiring to the piezoelectric element 13 without spoiling the piezoelectric element 13 or deteriorating the reliability thereof.

Figure 8A:
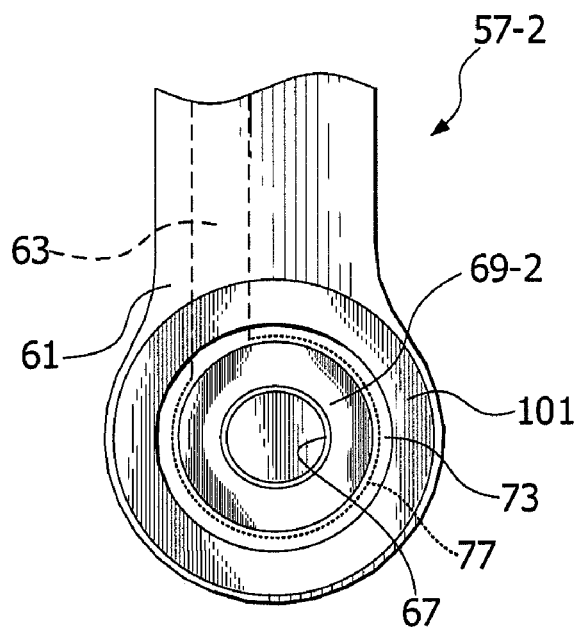
Figure 8B:
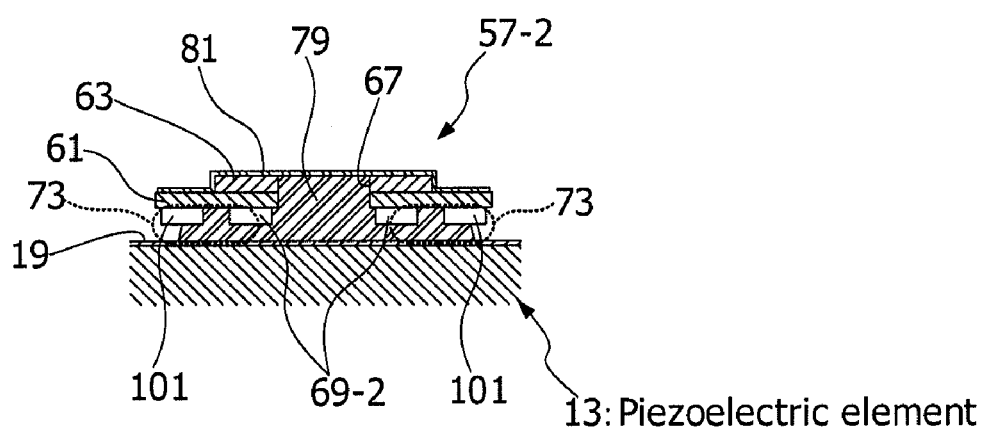

A wiring connecting structure for a piezoelectric actuator according to Embodiment 2 will be explained. This wiring connecting structure employs a terminal 57-2 illustrated in FIGS. 8A and 8B in which FIG. 8A is a front view seen from the piezoelectric element 13 side and FIG. 8B is a sectional view of an attached state taken along the line B-B of FIG. 4.

The terminal 57-2 according to Embodiment 2 includes a first liquid stopper 69-2 having an annular shape around the through hole 67 in a gap between the common electrode 19 and the terminal 57-2. Around the first liquid stopper 69-2, there is arranged a second liquid stopper 101 that is annular, has different diameter from the first liquid stopper 69-2, and is concentric with the first liquid stopper 69-2. An annular recess between the first and second liquid stoppers 69-2 and 101 defines a trapping space 77 of a liquid trap 73.

If the liquid conductive adhesive 79 filled in the through hole 67 is excessive and if the excess overflows the first liquid stopper 69-2, the excess is guided into the trapping space 77 of the liquid trap 73, i.e., the annular recess between the first and second liquid stoppers 69-2 and 101. Namely, even if the adhesive 79 filled in the through hole 67 is excessive, the excess is guided into the trapping space 77 of the annular liquid trap 73, to prevent the excess from oozing out.

The first and second liquid stoppers 69-2 and 101 are formed by partly leaving the conductive base 59 around the through hole 67 when the conductive base 59 in the area 65 (FIG. 5B) is etched off. In this case, the liquid stoppers 69-2 and 101 must electrically be insulated from the remaining part of the conductive base 59, to avoid a short circuit between the common electrode 19 and the conductive base 59.

Alternatively, the conductive base 59 in the area 65 (FIG. 5B) may completely be etched off, and then, the liquid stoppers 69-2 and 101 that are separate from the conductive base 59 may be arranged around the through hole 67.

According to Embodiment 2, outer edges of the first and second liquid stoppers 69-2 and 101 function as double banks. If the liquid conductive adhesive 79 overflows the outer edge of the first liquid stopper 69-2, the overflowed adhesive is contained within the outer edge of the second liquid stopper 101. As a result, Embodiment 2 secures electric connection between the common electrode 19 and the wiring 63 of the terminal 57-2 with a proper bonding strength and without mechanical stress on the piezoelectric element 13.

If the liquid conductive adhesive 79 filled in the through hole 67 is excessive, the excess is guided into the trapping space 77 of the liquid trap 73, i.e., the annular recess between the first and second liquid stoppers 69-2 and 101, thereby preventing the excess from oozing out. Namely, even if the liquid adhesive 79 is excessive, the excess never oozes outside.

Accordingly, Embodiment 2 can perform wiring to the piezoelectric element 13 without spoiling the piezoelectric element 13 or deteriorating the reliability thereof.

Figure 9A:
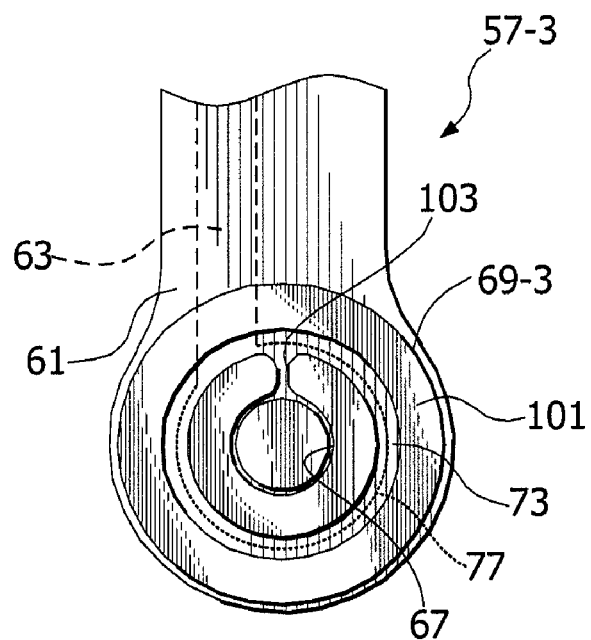
Figure 9B:
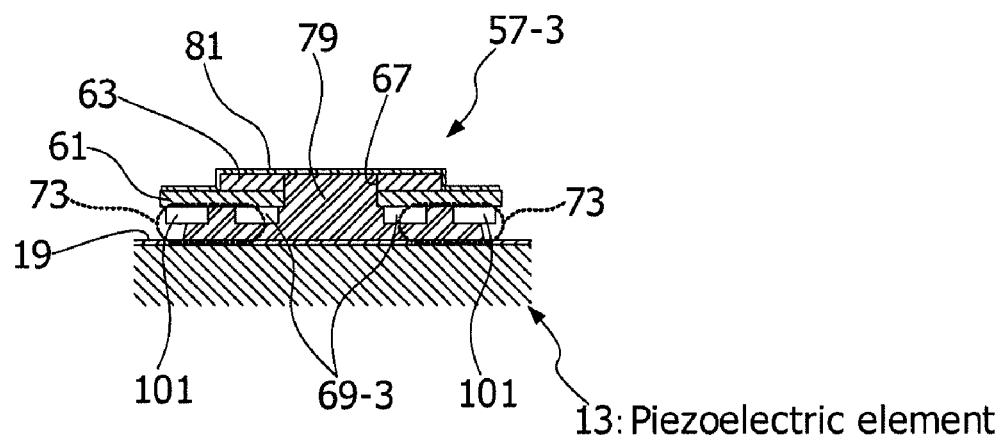

A wiring connecting structure for a piezoelectric actuator according to Embodiment 3 of the present invention will be explained. This wiring connecting structure employs a terminal 57-3 illustrated in FIGS. 9A and 9B in which FIG. 9A is a front view seen from the piezoelectric element 13 side and FIG. 9B is a sectional view of an attached state taken along the line B-B of FIG. 4.

The terminal 57-3 according to Embodiment 3 includes a first liquid stopper 69-3 having an annular shape around the through hole 67 in a gap between the common electrode 19 and the terminal 57-3. Around the first liquid stopper 69-3, there is arranged a second liquid stopper 101 that is annular, has different diameter from the first liquid stopper 69-3, and is concentric with the first liquid stopper 69-3. A circumferential part of the first liquid stopper 69-3 has a cut 103 that is characteristic to Embodiment 3.

An annular recess between the first and second liquid stoppers 69-3 and 101 defines a trapping space 77 of a liquid trap 73.

If the liquid conductive adhesive 79 filled in the through hole 67 is excessive, the excess is guided through the cut 103 into the trapping space 77 of the liquid trap 73, i.e., the annular recess between the first and second liquid stoppers 69-3 and 101. Namely, even if the adhesive 79 filled in the through hole 67 is excessive, the excess is guided into the trapping space 77 of the annular liquid trap 73, to prevent the excess from oozing out.

The first and second liquid stoppers 69-3 and 101 are formed by partly leaving the conductive base 59 around the through hole 67 when the conductive base 59 in the area 65 (FIG. 5B) is etched off. In this case, the liquid stoppers 69-3 and 101 must electrically be insulated from the remaining part of the conductive base 59, to avoid a short circuit between the common electrode 19 and the conductive base 59.

Alternatively, the conductive base 59 in the area 65 (FIG. 5B) may completely be etched off, and then, the liquid stoppers 69-3 and 101 that are separate from the conductive base 59 may be arranged around the through hole 67.

According to Embodiment 3, outer edges of the first and second liquid stoppers 69-3 and 101 function as double banks. If the liquid conductive adhesive 79 overflows the outer edge of the first liquid stopper 69-3 or the cut 103, the overflowed adhesive is contained within the outer edge of the second liquid stopper 101. As a result, Embodiment 3 secures electric connection between the common electrode 19 and the wiring 63 of the terminal 57-3 with a proper bonding strength and without mechanical stress on the piezoelectric element 13.

If the liquid conductive adhesive 79 filled in the through hole 67 is excessive, the excess is guided into the trapping space 77 of the liquid trap 73, i.e., the annular recess between the first and second liquid stoppers 69-3 and 101, thereby preventing the excess from oozing out. Namely, even if the liquid adhesive 79 is excessive, the excess never oozes outside.

Accordingly, Embodiment 3 can perform wiring to the piezoelectric element 13 without spoiling the piezoelectric element 13 or deteriorating the reliability thereof.

Returning to FIGS. 1 to 4, operation of the head suspension 31 will be explained. It is assumed that the first and second electrodes 15 and 17 of the piezoelectric element 13 are grounded and the common electrode 19 thereof receives a predetermined voltage.

The end face 23 of the first electrode 15 contracts and the end face 25 of the second electrode 17 extends as illustrated in FIG. 2, and therefore, the piezoelectric element 13 deforms into a trapezoid.

Namely, the piezoelectric element 13 minutely moves in the direction Z to move the load beam 35 on the drive side Y in a sway direction (a widthwise direction of the head suspension 31).

If the common electrode 19 is grounded and the first and second electrodes 15 and 17 receive a predetermined voltage, the piezoelectric element 13 minutely moves in the direction −Z to move the load beam 35 on the drive side Y in the opposite sway direction.

The head suspension 31 incorporating the piezoelectric actuator 11 needs three electric systems for the first and second electrodes 15 and 17 and common electrode 19 of the piezoelectric element 13. This configuration makes wiring to the piezoelectric element 13 easy and reliable.

The base plate 33 accommodates the piezoelectric element 13 in the opening 43 and supports the same from below. The opening 43 of the base plate 33 surrounds the piezoelectric element 13, to easily position the piezoelectric element 13 and protect the brittle piezoelectric element 13 from being damaged.

The common electrode 19 and terminal 57 that face each other are electrically connected to each other through a single connection (the conductive adhesive 79). This configuration reduces the number of wires arranged on the flexure 39 and increases the number of flexures to be produced from a material.

Although the present invention has been explained with reference to the embodiments, the embodiments are not intended to restrict the present invention. The embodiments are modifiable without departing from the scope and technical idea of the present invention stipulated or suggested in the claims and specification. Wiring connecting structures for piezoelectric elements, piezoelectric actuators, and head suspensions according to such modifications also fall in the scope of the present invention.

For example, the present invention also covers a head suspension that has the flexible parts 41*a* and 41*b* and opening 43 (FIG. 1) on an actuator plate 34 instead of on the base plate 33.

The "base part" mentioned in the claims conceptually includes the base plate 33 and actuator plate 34. Accordingly, the "base part" stipulated in the claims may be read as a "base plate" or an "actuator plate".

According to Embodiment 1 of the present invention, the first liquid stopper 69-1 of the terminal 57-1 has the annular stopper part 71 and the single liquid trap 73 that are integral with each other. This does not limit the present invention.

Figure 10A:
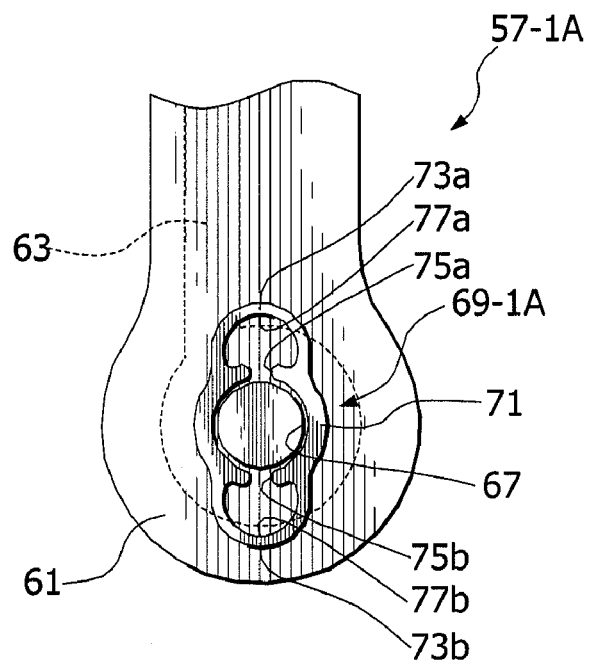
FIG. 10A is a view illustrating a terminal according to Modification 1 of Embodiment 1 of the present invention.
Figure 10B:
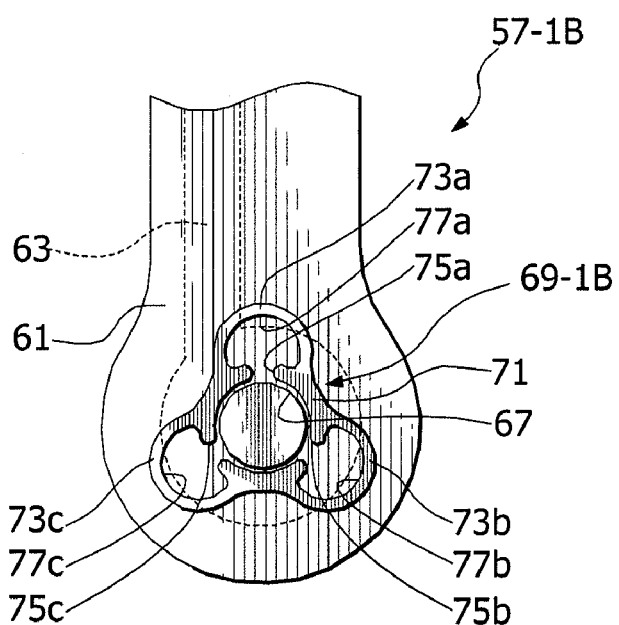
FIG. 10B is a view illustrating a terminal according to Modification 2 of Embodiment 1 of the present invention.

FIG. 10A is a view illustrating a terminal 57-1A according to Modification 1 of Embodiment 1 and FIG. 10B is a view illustrating a terminal 57-1B according to Modification 2 of Embodiment 1.

In FIG. 10A, the terminal 57-1A has an annular stopper part 71 and two liquid traps 73*a* and 73*b* that are integral with one another. In FIG. 10B, the terminal 57-1B has an annular stopper part 71 and three liquid traps 73*a*, 73*b*, and 73*c* that are integral with one another.

The number of liquid traps 73 arranged adjacent to the annular stopper part 71 is optional and is determined according to design conditions and the like.

According to Embodiment 3 of the present invention, the first liquid stopper 69-3 of the terminal 57-3 has the single cut 103. This does not limit the present invention.

Figure 11A:
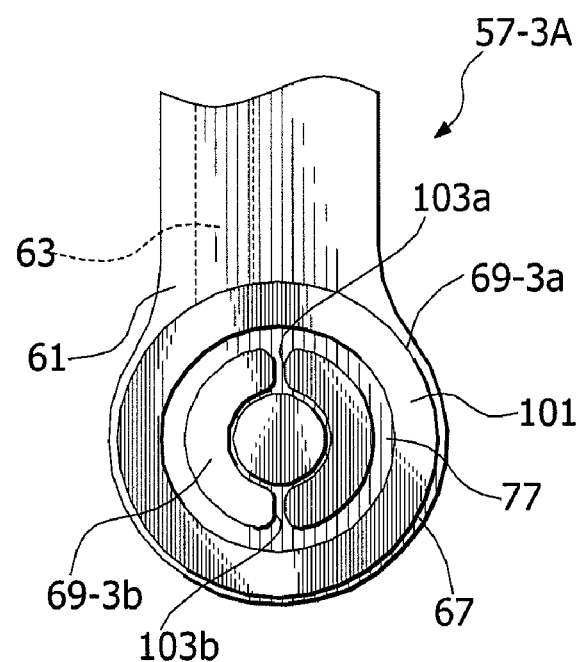
FIG. 11A is a view illustrating a terminal according to Modification 1 of Embodiment 3 of the present invention.
Figure 11B:
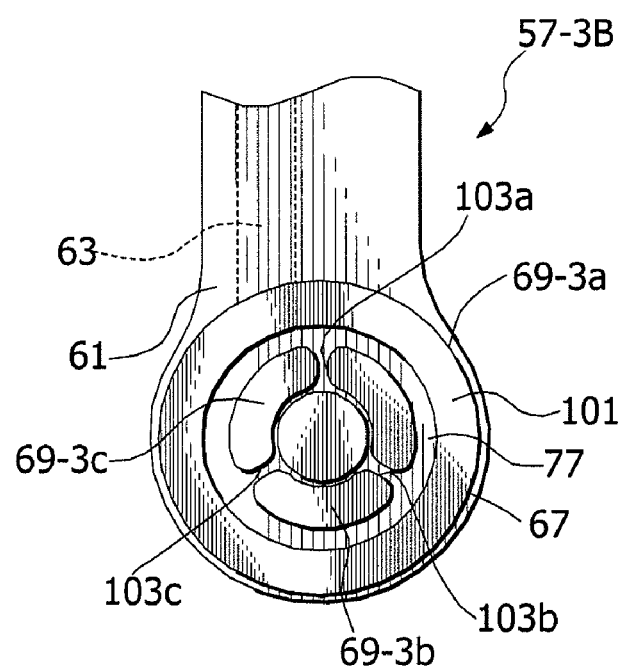
FIG. 11B is a view illustrating a terminal according to Modification 2 of Embodiment 3 of the present invention.

FIG. 11A is a view illustrating a terminal 57-3A according to Modification 1 of Embodiment 3 and FIG. 11B is a view illustrating a terminal 57-3B according to Modification 2 of Embodiment 3.

In FIG. 11A, the terminal 57-3A has a first liquid stopper 69-3 that has an annular shape and two cuts 103*a* and 103*b*. In FIG. 11B, the terminal 57-3B has a first liquid stopper 69-3 that has an annular shape and three cuts 103*a*, 103*b*, and 103*c*.

The number of cuts of the annular first liquid stopper is optional and is determined according to design conditions and the like.

According to the embodiments and modifications of the present invention, the through hole 67 is formed through the electric insulating layer 61 and wiring 63 of the terminal 57. This does not limit the present invention.

Figure 12:
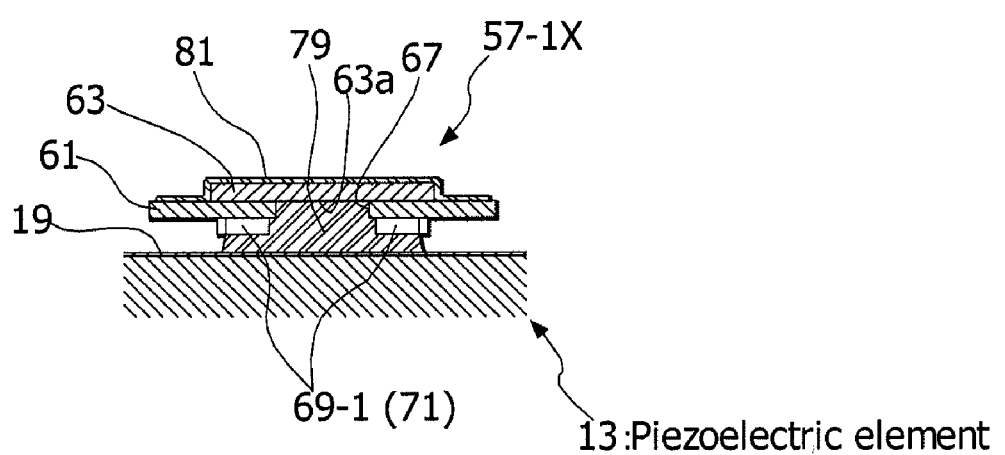
FIG. 12 is a view illustrating a terminal according to Modification 3 of Embodiment 1 of the present invention.

FIG. 12 is a view illustrating a terminal 57-1X according to Modification 3 of Embodiment 1 of the present invention.

In FIG. 12, the terminal 57-1X has wiring 63 that has no through hole. The wiring 63 has a surface area 63*a* that faces the common electrode 19 of the piezoelectric element 13 and is in contact with the conductive adhesive 79 filled in the through hole 67 that is formed through the insulating layer 61 of the terminal 57-1X, to secure electric connection between the common electrode 19 and the wiring 63.

According to the embodiments and modifications of the present invention, the piezoelectric actuator 11 is interposed between the base plate 33 and the load beam 35. This does not limit the present invention.

The present invention is applicable to a head suspension that is fixed to a carriage arm that is turned to move a magnetic head of the head suspension. In this case, the piezoelectric actuator is interposed between a base part and the magnetic head, to minutely move the head suspension, or a magnetic head slider, or the magnetic head.

According to the embodiments and modifications of the present invention, the first and second liquid stoppers 69 and 101 are annular and are concentrically arranged. This does not limit the present invention.

For example, a combination of the liquid stopper 69-1 having the liquid trap 73 illustrated in FIG. 6A and the annular second liquid stopper 101 illustrated in, for example, FIG. 8A is adoptable.

According to the embodiments and modifications of the present invention, the piezoelectric actuator 11 employs one piezoelectric element 13 to which the wiring connecting structure according to the present invention is applied. This does not limit the present invention.

Figure 13:
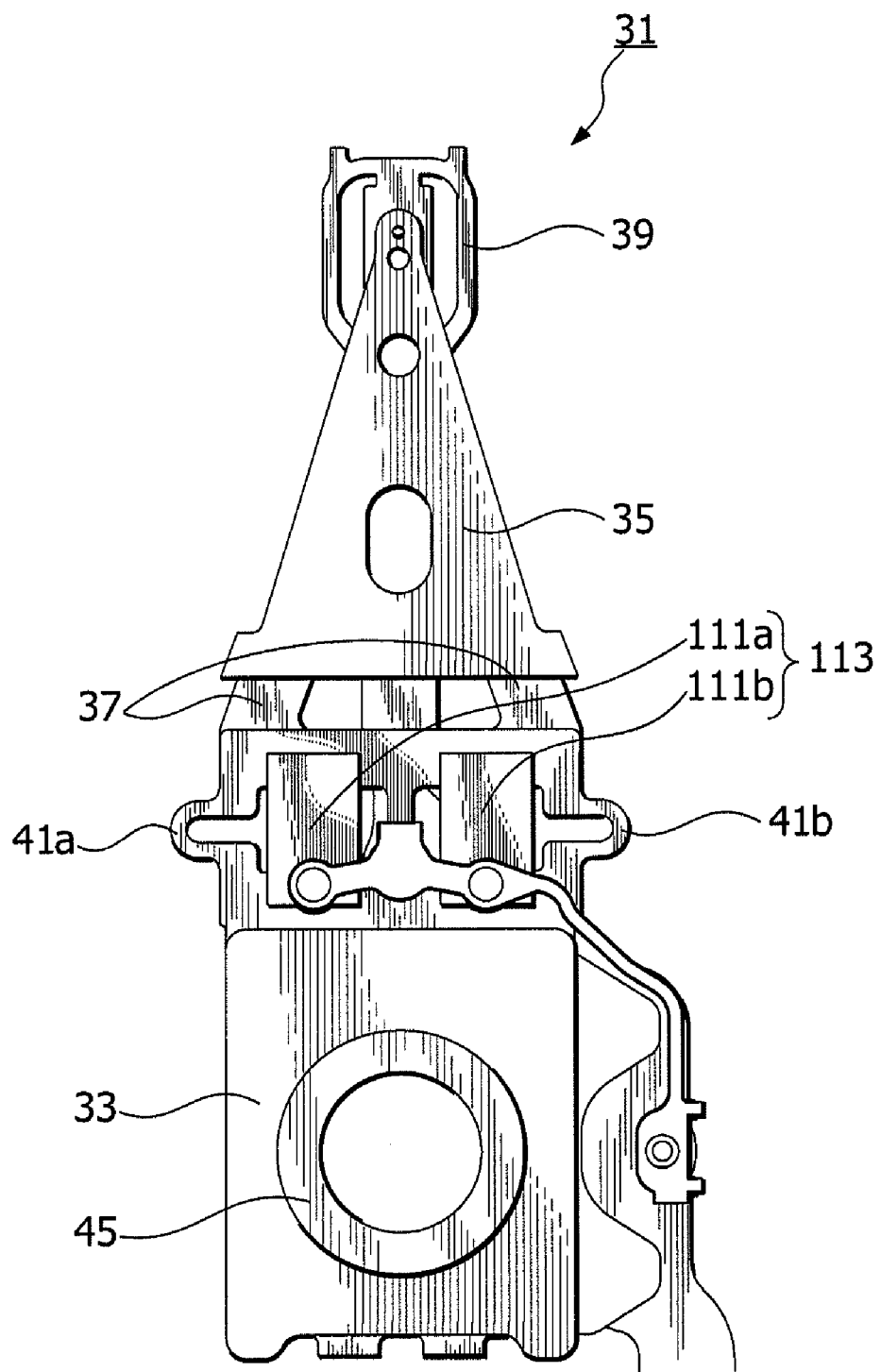
FIG. 13 is a general view illustrating a head suspension according to a modification of the present invention.

FIG. 13 is a view illustrating a head suspension according to a modification of the present invention.

In FIG. 13, a piezoelectric actuator 113 employs a pair of piezoelectric elements 111a and 111b and each of the piezoelectric elements 111a and 111b employs the wiring connecting structure of the present invention.

What is claimed is:

1. A wiring connecting structure for a piezoelectric actuator having a piezoelectric element, the piezoelectric element being arranged on an object having a base part and a movable part, to minutely move the movable part relative to the base part according to deformation that occurs on the piezoelectric element in response to electric power applied thereto, the wiring connecting structure comprising:
    a terminal having an electric insulating layer that faces an electrode surface of the piezoelectric element and a wiring layer that is formed on a surface of the insulating layer not facing the electrode surface and is used to supply electric power to the electrode surface;
    a through hole formed in the terminal through at least the insulating layer;
    a first liquid stopper annularly arranged around the through hole in a gap between the electrode surface and the terminal so that an inside of the first liquid stopper communicates with the through hole in a layer direction of the terminal;
    a liquid trap arranged adjacent to the first liquid stopper; and
    a conductive adhesive filled in the through hole, the conductive adhesive being liquid when filled into the through hole, the conductive adhesive electrically connecting the electrode surface and the wiring layer to each other, and
    wherein the first liquid stopper narrows the gap between the electrode surface and the terminal to define a narrow gap that causes a capillary phenomenon when the conductive adhesive is injected into the through hole so that the conductive adhesive diffuses and is maintained in the narrow gap, thereby stopping the conductive adhesive from spreading out of the first liquid stopper, and
    wherein the liquid trap has a trapping space to accept an excess of the conductive adhesive that may develop when the conductive adhesive is filled into the through hole.

2. The wiring connecting structure of claim 1, wherein: the liquid trap is integral with the first liquid stopper.

3. The wiring connecting structure of claim 1, further comprising:
    a second liquid stopper having an annular shape formed around the first liquid stopper in the gap between the electrode surface and the terminal,
    the trapping space of the liquid trap being defined between the first and second liquid stoppers.

4. The wiring connecting structure of claim 1, further comprising a conductive base layer; and
    wherein adjacent the terminal the conductive base layer, the electric insulating layer, and the wiring layer are sequentially layered one on another from the electrode surface side;
    wherein at the terminal an area of the conductive base layer corresponding to the electrode surface is removed by etching; and
    wherein the first liquid stopper is separate from the conductive base layer and is attached to one of the terminal and electrode surface.

5. The wiring connecting structure of claim 3, further comprising a conductive base layer; and
    wherein adjacent the terminal the conductive base layer, the electric insulating layer, and the wiring layer are sequentially layered one on another from the electrode surface side;
    wherein at the terminal an area of the conductive base layer corresponding to the electrode surface is removed by etching; and
    wherein the second liquid stopper is separate from the conductive base layer and is attached to one of the terminal and electrode surface.

6. The wiring connecting structure of claim 1, wherein:
    the terminal has a conductive base layer, the electric insulating layer, and the wiring layer that are sequentially layered one on another from the electrode surface side;
    an area of the conductive base layer corresponding to the electrode surface is removed by etching; and
    the first liquid stopper is made from the conductive base layer by partly leaving the conductive base layer around the through hole when removing the electrode surface corresponding area from the conductive base layer.

7. The wiring connecting structure of claim 3, wherein:
    the terminal has a conductive base layer, the electric insulating layer, and the wiring layer that are sequentially layered one on another from the electrode surface side;
    an area of the conductive base layer corresponding to the electrode surface is removed by etching; and
    the second liquid stopper is made from the conductive base layer by partly leaving the conductive base layer around the through hole when removing the electrode surface corresponding area from the conductive base layer.

8. The wiring connecting structure of claim 1, wherein: the first liquid stopper has a cut to guide an excess of the conductive adhesive toward the liquid trap.

9. A piezoelectric actuator comprising the wiring connecting structure of claim 1.

10. A head suspension having a base, a load beam, and a piezoelectric actuator, the piezoelectric actuator including a piezoelectric element that deforms in response to electric power applied thereto, to minutely move a front end of the load beam relative to the base according to the deformation, the head suspension comprising:
    a flexure having an electric insulating layer that faces an electrode surface of the piezoelectric element and a wiring layer that is formed on a surface of the insulating layer not facing the electrode surface and is used to supply electric power to the electrode surface;
    a through hole formed in the flexure through at least the insulating layer;
    a first liquid stopper annularly arranged around the through hole in a gap between the electrode surface and the flexure so that an inside of the first liquid stopper communicates with the through hole in a layer direction of the flexure;
    a liquid trap arranged adjacent to the first liquid stopper; and
    a conductive adhesive filled in the through hole, the conductive adhesive being liquid when filled into the through hole, the conductive adhesive electrically connecting the electrode surface and the wiring layer to each other, and wherein the first liquid stopper narrows the gap between the electrode surface and the flexure to define a narrow gap that causes a capillary phenomenon when the conductive adhesive is injected into the through hole so that the conductive adhesive diffuses and is maintained in the narrow gap, thereby stopping the conductive adhesive from spreading out of the first liquid stopper, and wherein the liquid trap has a trapping space to accept an excess of the conductive adhesive that may develop when the conductive adhesive is filled into the through hole.

* * * * *